(12) United States Patent
Tobin

(10) Patent No.: US 6,716,086 B1
(45) Date of Patent: Apr. 6, 2004

(54) EDGE CONTACT LOADCUP

(75) Inventor: Jim Tobin, Fremont, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/414,907

(22) Filed: Oct. 8, 1999

Related U.S. Application Data

(60) Provisional application No. 60/139,144, filed on Jun. 14, 1999.

(51) Int. Cl.[7] .............................................. B24B 49/00
(52) U.S. Cl. ......................... 451/8; 451/332; 451/339
(58) Field of Search .............................. 451/8, 332, 339

(56) References Cited

U.S. PATENT DOCUMENTS

| | | | | |
|---|---|---|---|---|
| 5,329,732 A | * | 7/1994 | Karlsrud et al. | |
| 5,738,574 A | | 4/1998 | Tolles et al. | 451/288 |
| 5,762,543 A | * | 6/1998 | Kasprzyk et al. | |
| 5,934,984 A | | 8/1999 | Togawa et al. | 451/288 |
| 5,947,802 A | * | 9/1999 | Zhang et al. | |
| 6,074,275 A | * | 6/2000 | Yashiki et al. | |
| 6,131,589 A | * | 10/2000 | Vogtmann et al. | 134/113 |

FOREIGN PATENT DOCUMENTS

| | | | | |
|---|---|---|---|---|
| EP | 0347718 A | 12/1989 | | H01L/21/00 |
| SU | 1323350 A | 7/1987 | | B24B/31/00 |
| WO | WO 99/41022 A | 8/1999 | | B08B/3/04 |

\* cited by examiner

Primary Examiner—Lee D. Wilson
Assistant Examiner—David Shanley
(74) Attorney, Agent, or Firm—Moser, Patterson & Sheridan

(57) ABSTRACT

A semiconductor wafer processing apparatus, more specifically, an edge contact loadcup for locating a semiconductor workpiece or wafer into a chemical mechanical retaining ring utilizing a cone, wafer chuck and flexure. The cone aligns the wafer concentrically to the retaining ring. The wafer chuck, inside the cone, is restrained from moving laterally in respect to the cone by the flexure. The wafer, which is supported by the wafer chuck, is moved into the retaining ring by the wafer chuck after the cone has become aligned with the retaining ring. An adjustment mechanism is provided to ensure the co-planar orientation of the wafer and fixture. Other embodiments include a sensor for detecting the presence of the wafer on the chuck, and in the cone, and minimizes particulate contamination to the wafer.

28 Claims, 9 Drawing Sheets

EDGE CONTACT LOADCUP

This application claims the benefit of U.S. Provisional Application No. 60/139,144, filed Jun. 14, 1999, and is hereby incorporated herein by reference.

BACKGROUND OF THE DISCLOSURE

1. Field of Invention

The present invention relates generally to a semiconductor wafer chemical mechanical polishing system. More specifically, the invention relates to a loadcup for positioning a workpiece or semiconductor wafer into a retaining ring of a chemical mechanical polishing system.

2. Background of Prior Art

In semiconductor wafer processing, the use of chemical mechanical polishing, or CMP, has gained favor due to the enhanced ability to stack multiple feature layers on a semiconductor workpiece, or wafer. As the demand for polishing wafers as part of a semiconductor fabrication process increases, the requirement for higher processing rates while minimizing risk of wafer damage and contamination has correspondingly experienced greater urgency for improvement.

Two such CMP systems that address these issues are described in a patent to Perlov et al. (U.S. Pat. No. 5,804,507, issued Sep. 8, 1998) and in a patent to Tolles et al. (U.S. Pat. No. 5,738,574, issued Apr. 15, 1998). The Perlov et al. and Tolles et al. patents are hereby incorporated by reference. The Perlov et al. and Tolles et al. patents disclose a CMP system having a polishing apparatus that is supplied wafers from cassettes located in an adjacent liquid filled bath. A transfer mechanism, or robot, facilitates the transfer of the wafers from the bath to a transfer station.

A pedestal within the transfer station rises to receive the wafer from the robot. The wafer is released from the robot and secured, or chucked, to the pedestal by a vacuum chuck. The pedestal is then retracted into the transfer station wherein the wafer is released temporarily from the pedestal so that a plurality of alignment jaws may manipulate the wafer into a position centered upon the pedestal. The wafer is then re-chucked to the pedestal and the pedestal rises to engage and transfer the wafer to a retaining ring of a polishing head. The alignment of the wafer to the center of the pedestal ensures that the wafer will be properly fixtured into the retaining ring.

After the wafer is fixtured into the retaining ring, a carousel delivers the retaining ring and wafer to a polishing station. After completion of the polishing process, the wafer is returned back through the pedestal to the proper cassette located in the bath.

Although this process has proven to be an efficient mechanism for loading and unloading wafers into and out of the chemical mechanical polishing system, an improvement has been identified which could enhance the transfer of the wafer into the retaining ring, reducing the risk of wafer damage and contamination, while increasing the centering accuracy of the wafer on the pedestal chuck and to the retaining ring, and improving the reliability of wafer loading, minimized wafer breakage, and lowered particulate contamination to the wafer inprocess.

More specifically, the process of aligning the wafer to the center of the pedestal requires raising and lowering the pedestal. Elimination of the need to lower the pedestal into the transfer station would improve the routing time require to process each wafer, and yield a corresponding increase in wafer throughput. Additionally, as the process of alignment requires both contact of the alignment jaws to the wafer and the physical sliding of the wafer upon the pedestal, both actions incur the possibility of wafer damage and particulate contamination. This is of special concern since any abrasion, scratching or other damage would be occurring on the feature side of the wafer.

Therefore, there is a need in the art for an apparatus that facilitates wafer transfer into a CMP retaining ring wherein centering accuracy of the wafer to the pedestal chuck and the retaining ring is improved, while minimizing wafer breakage and particulate contamination.

SUMMARY OF INVENTION

The disadvantages associated with the prior art are overcome by the present invention of an edge contact loadcup for positioning a semiconductor wafer in a fixture such as a retaining ring of a Chemical Mechanical Polishing system. More specifically, the edge contact loadcup or loadcup comprises a cone and a workpiece (or wafer) chuck connected to one another by a flexure. The flexure prevents lateral movement of the workpiece chuck in relation to cone, while permitting axial movement between the wafer chuck and the cone.

A semiconductor workpiece, or wafer, is placed on the elevated wafer chuck by a transfer mechanism (or robot). The cone and the wafer chuck have an inner tapered surface that centers the wafer by edge contact. Once the wafer is positioned inside the cone, a first actuator is activated to move the cone upwards to interface with the retaining ring that is used to hold the wafer during chemical mechanical polishing. The cone aligns concentrically with the retaining ring as the cone and the retaining ring mate, thus, correspondingly concentrically aligning the wafer with the retaining ring. The chuck and the wafer chuck to continue moving vertically after the cone has seated in the retaining ring, until the wafer is loaded into the retaining ring.

A wafer sensing device is optionally incorporated into the loadcup mechanism. The sensing device comprises at least one fluid portal. Fluid exiting the portal impinges upon the wafer, creating a back pressure. The back pressure of the fluid is sensed to indicate the presence and/or proper alignment of the wafer.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical element that are common to the figures.

DETAIL DESCRIPTION OF INVENTION

Figure 1:
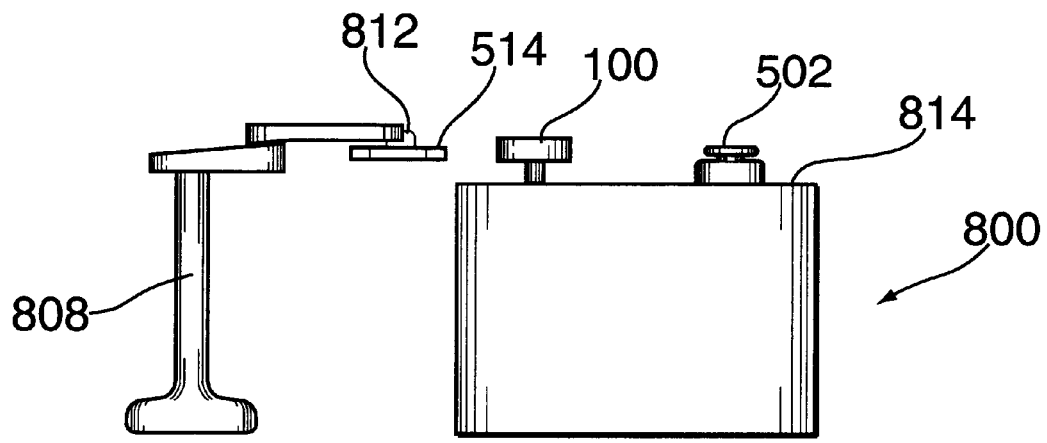
FIG. 1 is a schematic frontal view of a chemical mechanical polisher of the present invention.
Figure 2:
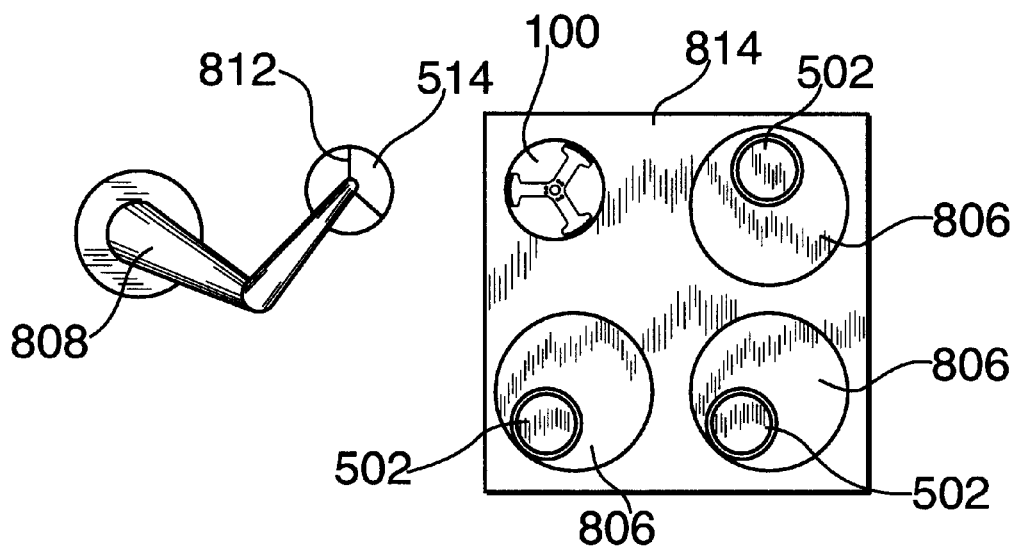
FIG. 2 is a schematic top view of the chemical mechanical polisher of FIG. 1.

A chemical mechanical polisher 800 is schematically depicted in FIG. 1 and FIG. 2. The reader is encouraged to simultaneously refer to both FIG. 1 and FIG. 2 for the best understanding of the invention. The polisher 800 has a plurality of polishing stations 806, i.e. three, and an edge contact loadcup 100. The polishing stations 806 and the loadcup 100 are accessible from a top surface 814 of the polisher 800. Each polishing station 806 is serviced by a retaining ring 502 that moves between the loadcup 100 and the polishing stations 806. For clarity, the assembly, a polishing head carousel, that supports and moves the retaining ring 502 is not shown in FIG. 1 and FIG. 2.

A wafer 514 is transferred between the polisher 800 and other systems or cassettes (not shown) via a wafer transfer mechanism (or robot) 808. The transfer mechanism 808 has a gripper-like device 812 which holds the wafer 514 during transfer, and sets the wafer 514 into the loadcup 100. After the loadcup 100 receives the wafer 514 from the robot 808 and the robot 808 has cleared the cup 100, the loadcup 100 rises to "fixture" the wafer 514 into the retaining ring 502. The retaining ring 502 then moves the wafer to a polishing station 806 for further processing.

Figure 3:
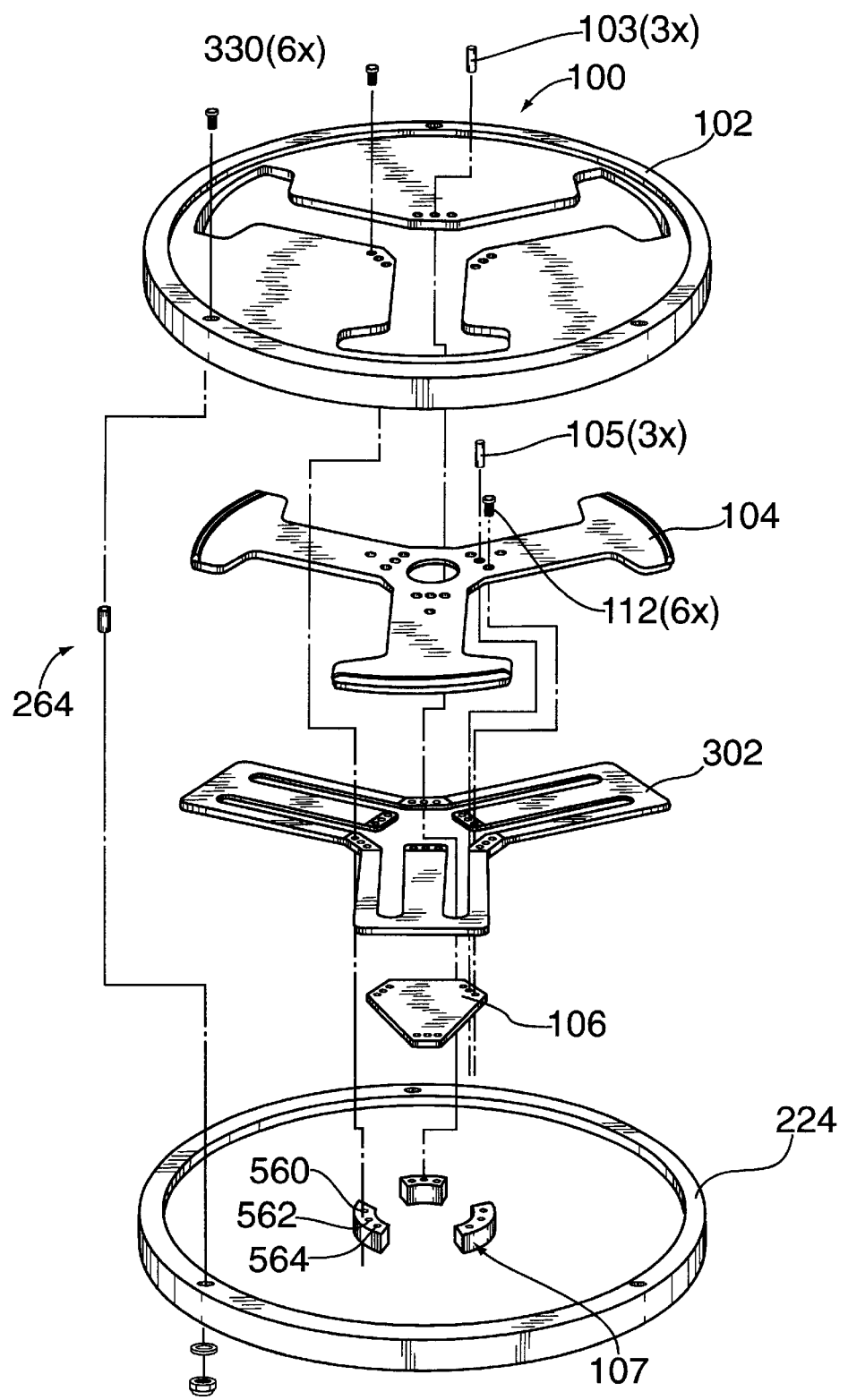
FIG. 3 is a simplified exploded perspective of the edge contact loadcup of the present invention.

The loadcup 100 is generally depicted in the simplified exploded view of FIG. 3. The loadcup 100 has a cone 102, a wafer chuck 104, a flexure 302, a flexure clamp plate 106, three flexure clamp blocks 107, and a cone support plate 224. The flexure 302 is fastened to the cone 102 in three locations by the flexure clamp blocks 107 and plurality of fasteners 330 (one of which is shown). The flexure 302 is aligned with the cone 102 through the use of a plurality of dowel pins 103 (i.e., 3 dowel pins, one of which is shown), disposed through the cone 102, the flexure 302 and the flexure clamp block 107. The flexure 302 is also fastened between the wafer chuck 104 and the flexure clamp plate 106 in six locations by a plurality of fasteners 112 (one of which is shown). The flexure 302 is aligned with the wafer chuck 104 through the use of a plurality of dowel pins 105 (i.e., 3 dowel pins, one of which is shown), disposed through the wafer chuck 104, the flexure 302 and the flexure clamp plate 106. The fasteners 330 and 112 can be machine screws or other suitable fastening devices such as rivets, screws, adhesives, staking and the like. The cone support plate 224 is movably connected to the cone 102 by a pin assembly 264. The cone 102 and wafer chuck 104 may be fabricated from any number of materials, although polymers are preferred.

Figure 4:
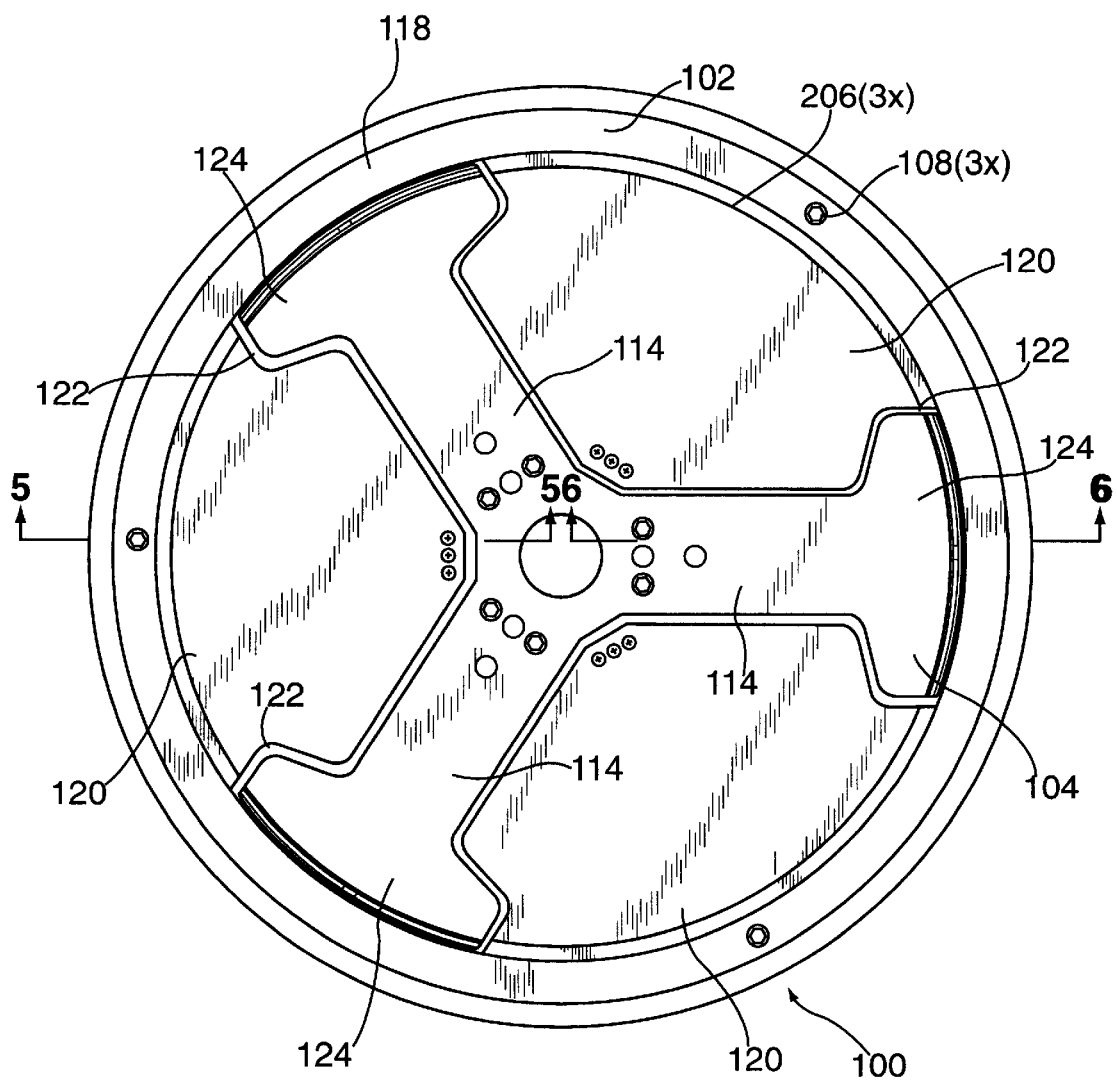
FIG. 4 is a top view the edge contact loadcup.
Figure 5:
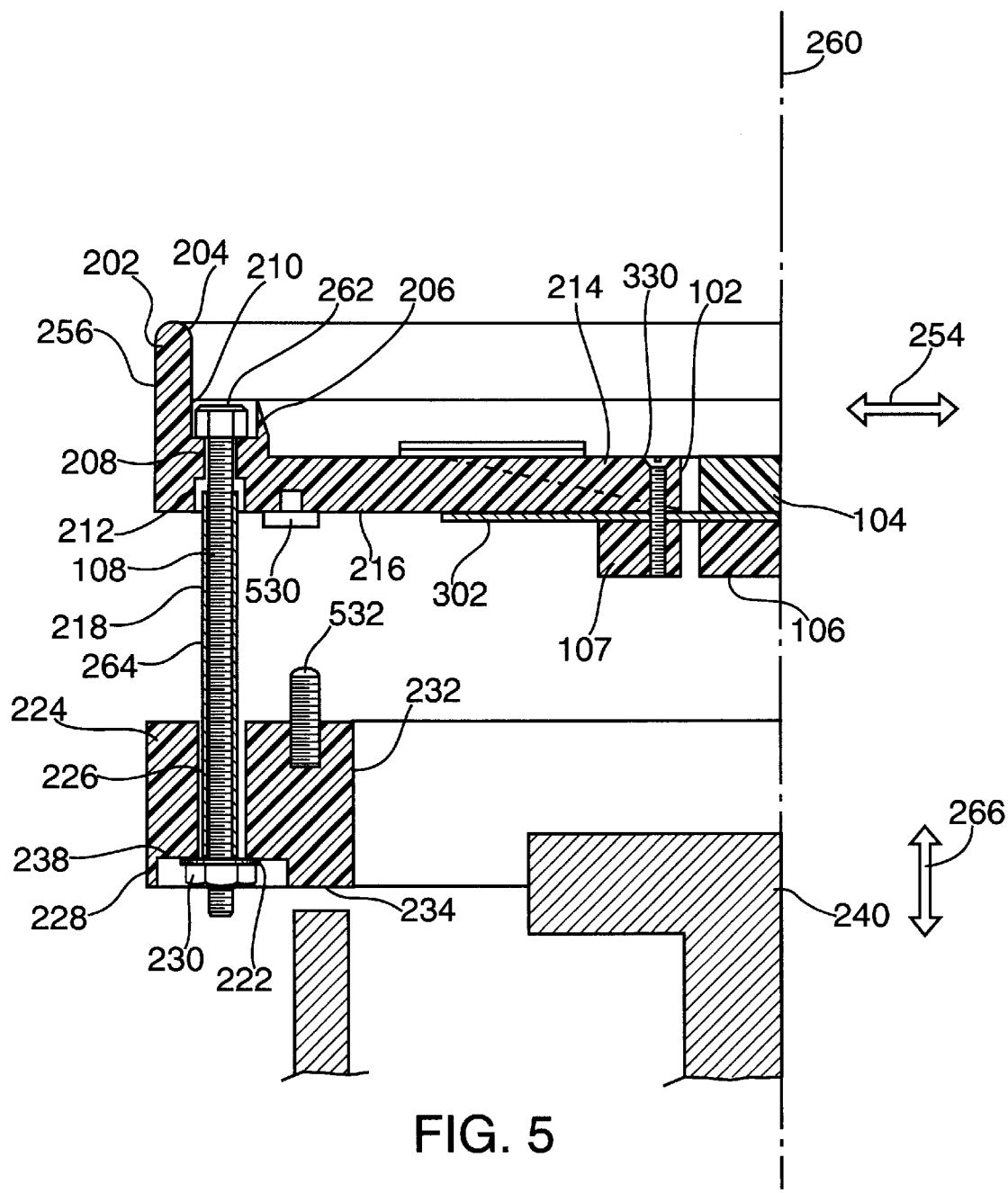
FIG. 5 is a cross sectional view of the edge contact loadcup of FIG. 4 along section lines 5—5 and two actuators.
Figure 6:
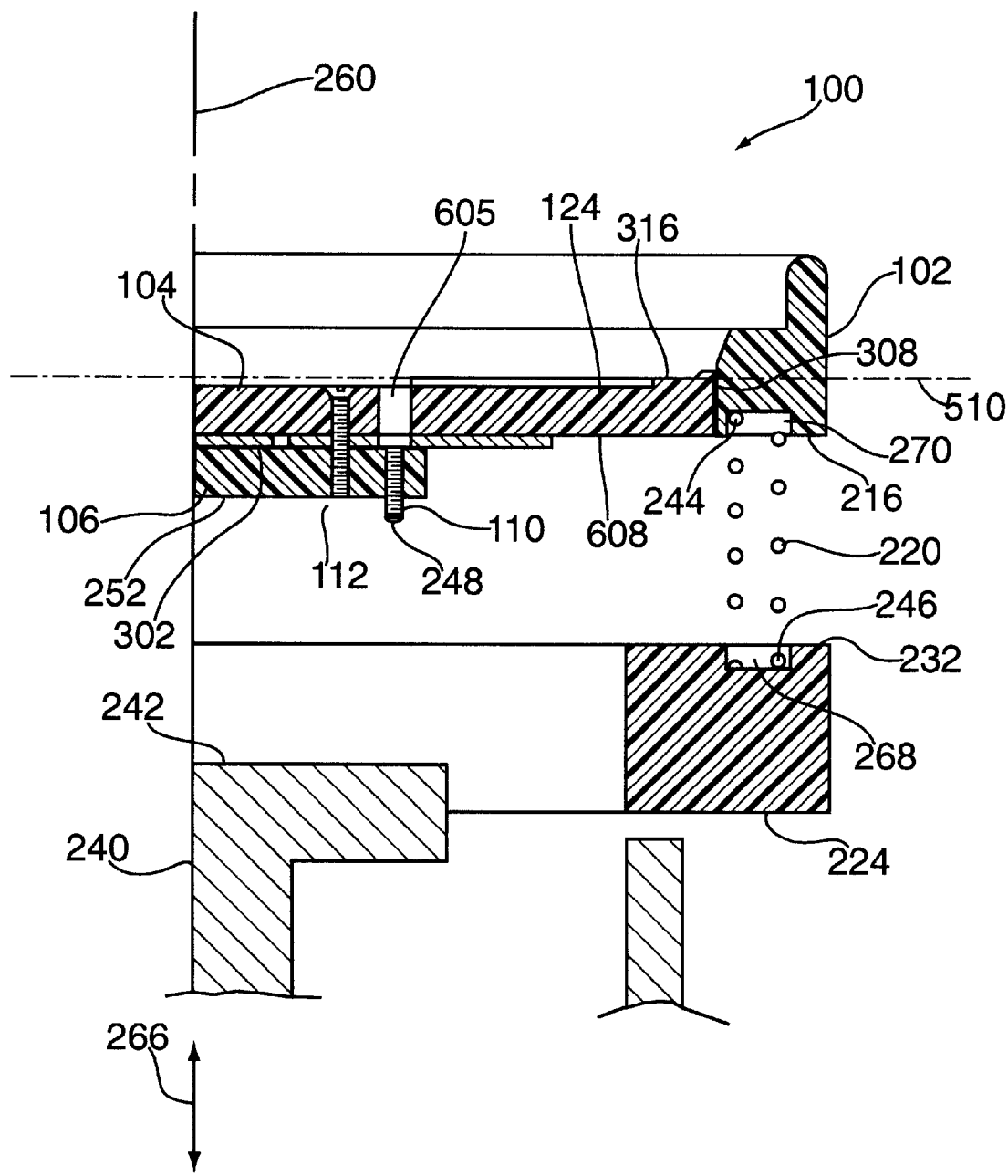
FIG. 6 is a cross sectional view of the edge contact loadcup of FIG. 4 along section lines 6—6 and two actuators.

The cone 102 can be best understood by simultaneously viewing the details of FIG. 4, FIG. 5 and FIG. 6. The cone 102 has an outer ring 118 that has three webs 120 projecting radially inwards. The outer ring 118 and webs 120 define a wafer chuck passage 122.

Passing through three holes 208 in the outer ring 118 of the cone 102 are three retaining bolts 108. The holes 208 are equally spaced in a polar array about a centerline 260. The bolts 108 pass from a first side 214 of the cone 102, and exits a second side 216. The hole 208 has a first counter bore 210 on the first side 214 and a second counter bore 212 on the second side 216. The cone 102 also has a plurality, e.g. nine, third counter bores 270 on the second side 216. The third counter bores 270 are also positioned in an equally spaced polar array about the centerline 260, located near an outer edge 256 of the cone 102. The third counter bores 270 and the second counter bores 212 share the same positional radius as the holes 208.

The outer ring 118 of the cone 102 has a lip 202 protruding from the first side 214. The lip 202 has a lip radius 204 on the inner diameter. The outer ring 118 also has three wafer guides 206 located on the inner diameter of the outer ring 118 on the first side 214. The wafer guides 206 forms a 20–30° angle with respect to the centerline 260. The wafer guide 206 is concentric with the lip 202.

The flexure clamp blocks 107 are best understood by simultaneously viewing FIG. 3 and FIG. 5. The flexure clamp blocks 107 are, for example, aluminum. Each flexure clamp block 107 has a first hole 560, a second hole 562 and a third hole 564. The first hole 560 and the third hole 564 are threaded to accept the fastener 330. The second hole 562 is sized to accept the dowel pin 105.

The cone support plate 224 is best understood by simultaneously viewing FIG. 5 and FIG. 6. The cone support plate 224 has a first side 232, a second side 234, and an inner diameter 236. The cone support plate 224 has a plurality of guide holes 226. Each guide hole 226. has a first counter bore 228 on the second side 234 of the cone support plate 224 concentric with the guide holes 226. At the bottom of each first counter bore 228 is a step 238. The guide holes 226 are of the same quantity and positional geometry as the through holes 208 of the cone 102. Also the cone support plate 224 has a plurality of second counter bores 268 on the first side 232. The counter bores 268 are of the same quantity and positional geometry as the third counter bores 270 of the cone 102.

The pin assembly 264 as seen in FIG. 3 and FIG. 5, has a retaining bolt 108, an alignment pin 218, a pad 222, and a nut 230. A head 262 of the retaining bolt 108 resides within the first counter bore 210. The retaining bolt 108 passes through the through hole 208 in the cone 102, and through the alignment pin 218 where pad 222 slips on the lower end of the alignment pin 218. The pad 222 is fabricated from a non-corrosive material, such as a polymer or stainless steel. The pad 222 is retained on the alignment pin 218 by the nut 230 onto the retaining bolt 108, thus capturing the alignment pin 218 to the cone 102. The alignment pin 218 is partially disposed within the guide hole 226. The alignment pin 218 has sufficient clearance with the guide hole 226 as to allow the cone 102 (and the other components attached to the cone 102) to move laterally as depicted by arrow 254.

Figure 8:
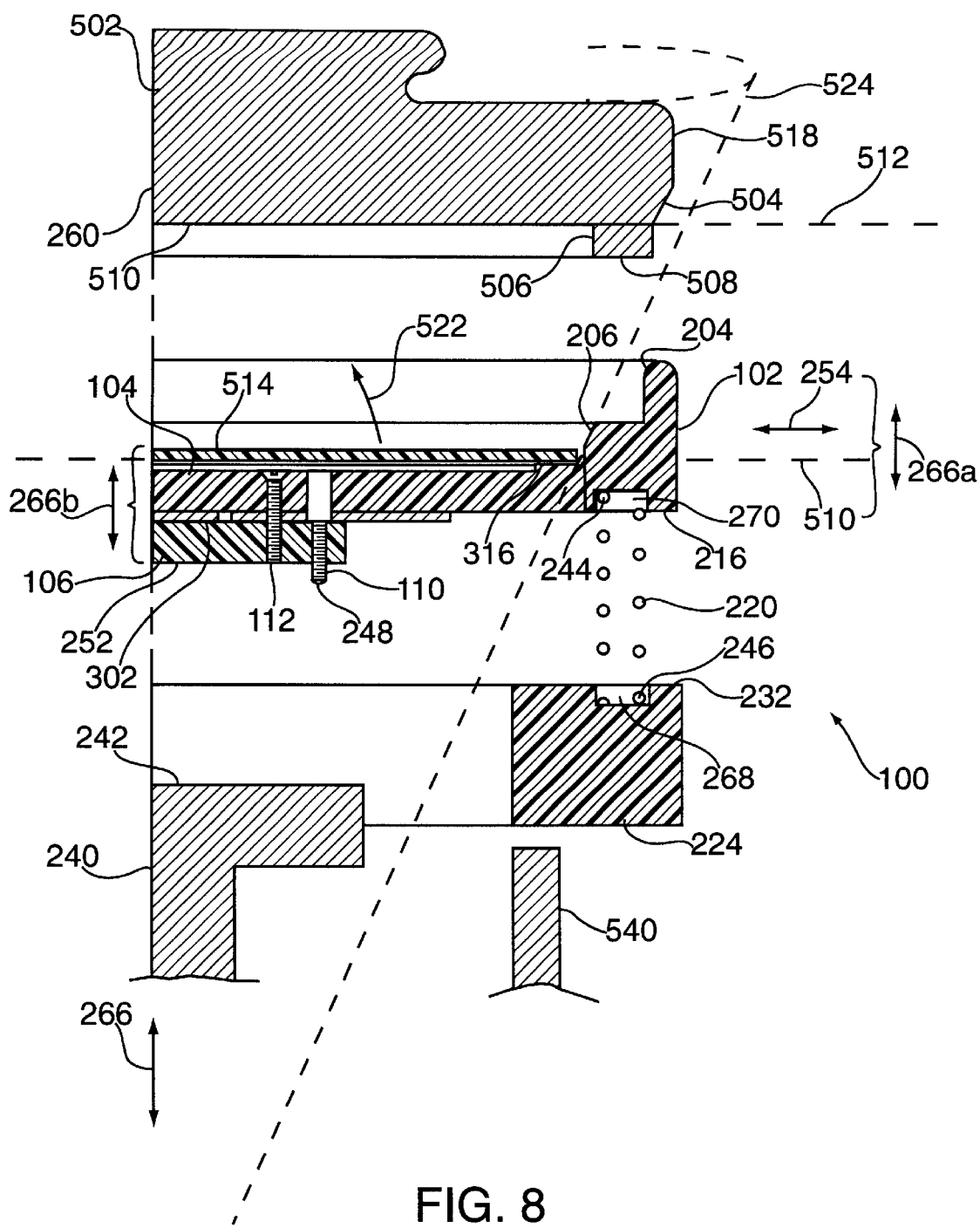
FIG. 8 is the cross sectional view of FIG. 6 shown along with a wafer, actuators and a retaining ring.
Figure 9:
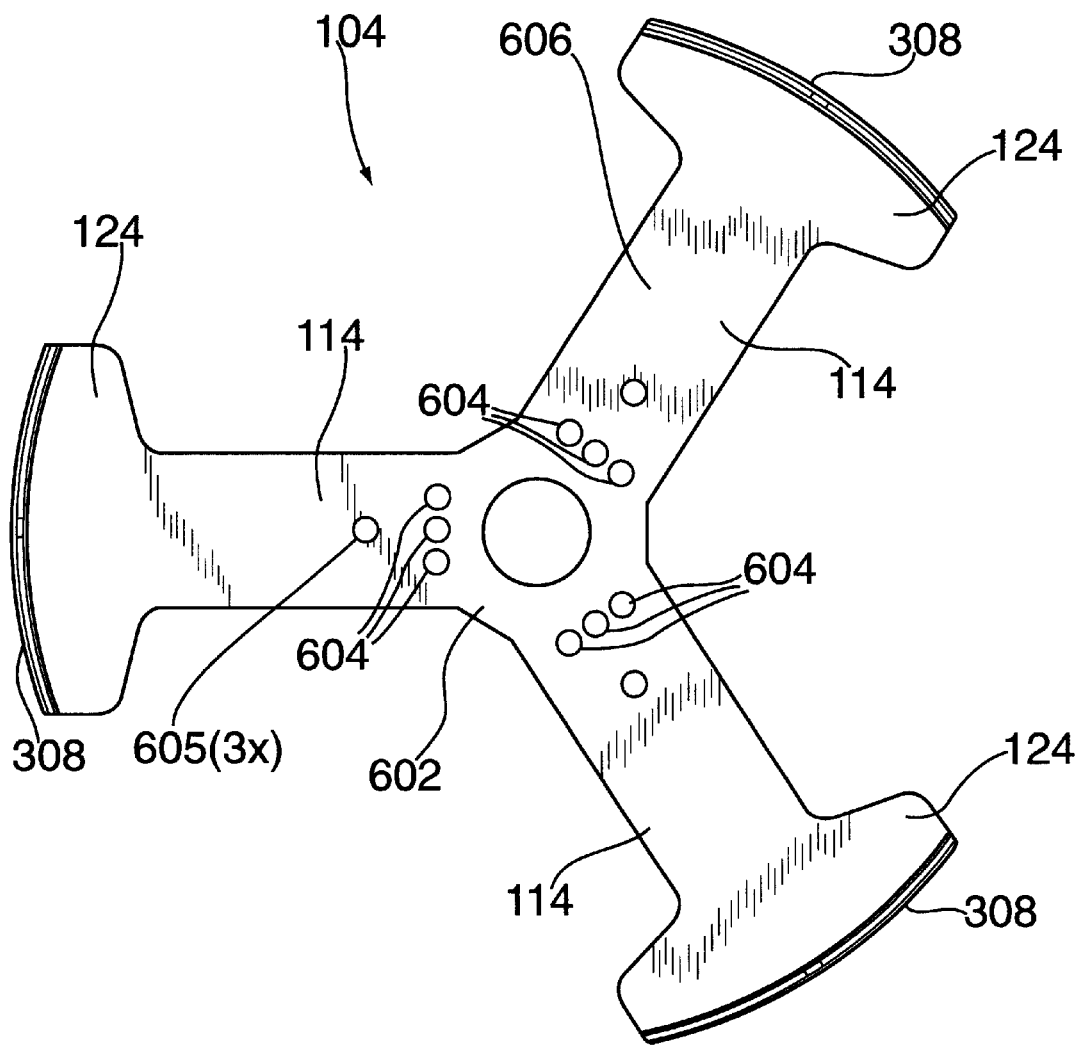
FIG. 9 is a top view of the wafer chuck.

Referring primarily to FIG. 6, a plurality of springs 220 are captured between the cone 102 and the cone support plate 224. Each spring 220 has a first end 244 and a second end 246. The first end 224 of each spring 220 is disposed in each third counter bore 270 of the cone 102 while the second end 246 of the spring 220 is disposed in the second counter bore 268 of the cone support plate 224. The springs 220 have a light spring constant selected to separate the cone 102 and the cone support plate 224 while at rest, forcing the pad 222 against the step 238 as discussed above and seen when viewing FIG. 5 and FIG. 6 simultaneously. In response to light forces applied to the cone 102 by vertical contact with the retaining ring 502, the pads 222 are unseated from the step 238, allowing the springs 220 to permit the cone 102 to move laterally relative to the cone support plate 224. The ability of the cone 102 to "float" (as depicted by arrow 254) in relation to the cone support plate 224 is due to the clearances between the alignment pins 218 and the guide hole 226. This "float" enables the cone 102 (as seen in FIG. 8) to become concentrically aligned with the retaining ring 502 prior to the wafer 514 being positioned into the retaining ring 502. Vertical deflection of the cone 102 relative the cone support plate 224 is adjustably limited by contact between a rest button 530 disposed on the second side 216 of the wafer chuck 104 and a protruding, adjustable stop screw 532, threaded into the cone support plate 224, as shown on FIG. 5.

The wafer chuck 104 is best understood by simultaneously referring to FIG. 3, FIG. 4, FIG. 5 and FIG. 6 and FIG. 9. The wafer chuck 104 has a first side 606, a second side 608, and a center 602. The center 602 has a plurality of holes 604 for accepting the dowel pin 105 and the screws 112 that locate and fasten the flexure 302 and plate 106 to the second side 608 of the flexure 302. Three legs 114 extend radially outwards from the center 602. Disposed in each leg 114 is an access hole 605. The access hole 605 allows for the chuck adjustment screws 110 to be tuned (see FIG. 6). Each leg 114 terminates in a T-shaped end 124. The T-shaped end 124 has a raised wafer contact surface 316. The wafer contact surface 316 may have a step shape or alternatively be a raised pin. The wafer contact surface 316 provides a surface for the wafer 514 to rest upon while in the loadcup 100 (see FIG. 8). The wafer 514 resting upon the wafer contact surface 316 defines an imaginary plane 510.

The wafer chuck 104 substantially concentric with cone 102. The wafer chuck 104 is dimensioned as to allow the wafer chuck 104 to travel through the chuck passage 122 of the cone 102. The clearance between the wafer chuck 104 and cone 102 is such that the wafer chuck 104 may rock, pitch, and move axially about and along the centerline 260 without contacting the cone 102. The number of legs 114 comprising the wafer chuck 104 are not critical as one skilled in the art can readily duplicate the utility of the invention by using a different number of legs 114 and making the necessary corresponding changes needed to accommodate the shape of the wafer chuck 104, the passage 122, and the flexure 302.

Figure 7:
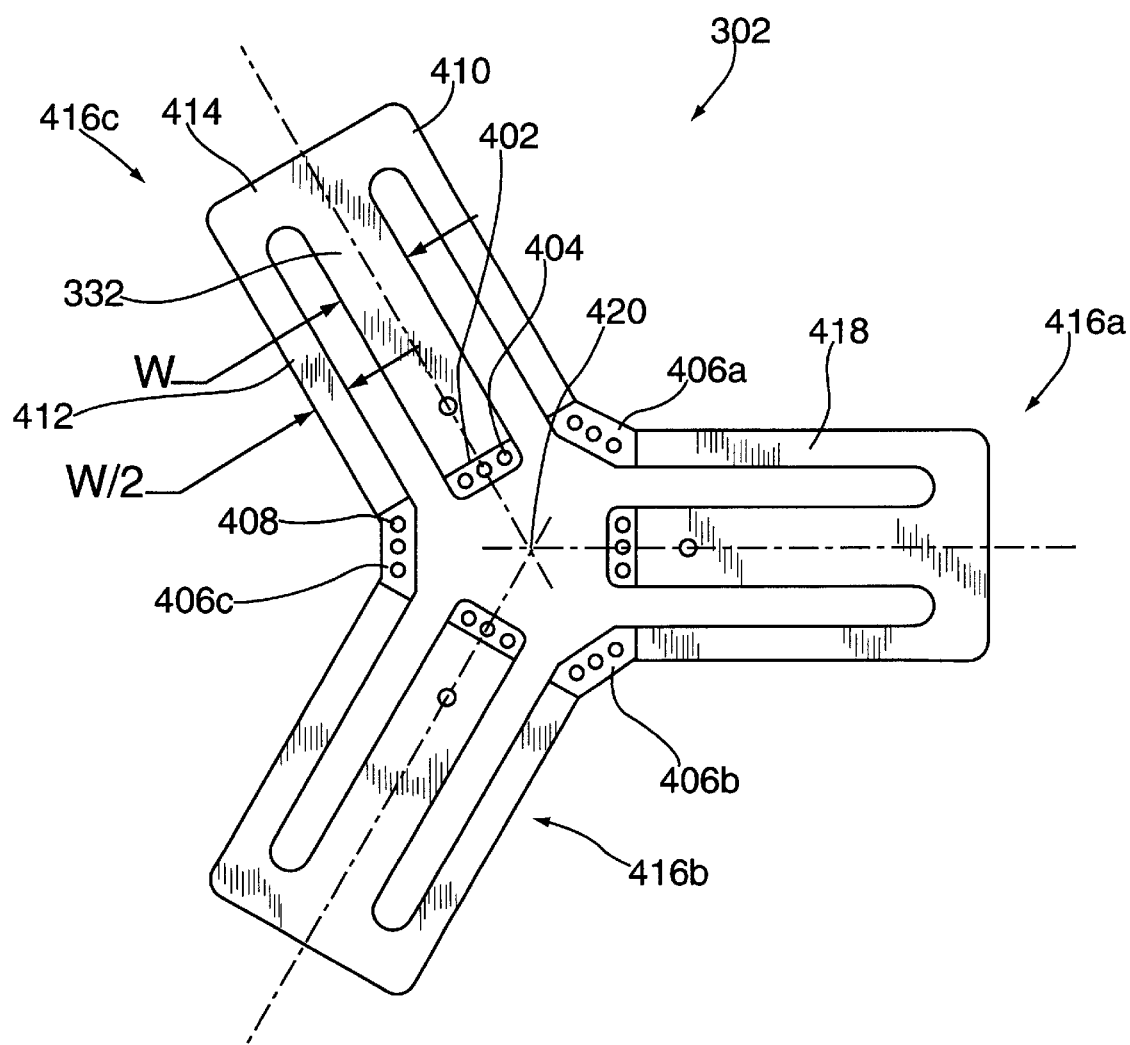
FIG. 7 is a top view of the flexure.

The flexure 302 is depicted in greater detail in FIG. 7. The reader is encouraged to additionally refer to FIG. 8 to understand the interrelation of the flexure 302 to other components of the invention. The flexure 302 has three radial elements 416a, 416b, and 416c, and three connecting tabs 406a, 406b, and 406c. The connecting tabs 406a, 406b, and 406c have a plurality of mounting holes 408. The tabs 406a, 406b, and 406c are fastened between the wafer chuck 104 and flexure clamp plate 106 by the screws 112.

Each radial element 416a, 416b, and 416c has a first outside prong 410, a second outside prong 412 and a middle prong 332 that are parallel to each other and connected to one another by an end 414. The first outside prong 410 and the second outside prong 412 have a width of W/2. The middle prong 332 has a width of W.

The middle prong 332 typically 3 or more places terminates in a mounting tab 402. The mounting tab 402 has a plurality of mounting holes 404. The screws 330 fasten the mounting tab 402 between the cone 102 and the flexure clamp block 107 as shown in FIG. 5.

The outside leg 410 of radial element 416c is connected to the connecting tab 406a. An adjacent outside leg 418 of the adjacent radial element 416a is also connected to connecting tab 406a. The pattern of connecting adjacent legs is repeated until the three radial elements 416a, 416b, and 416c are connected about the flexure center 420.

The flexure 302 may be fabricated from any resilient material suitable for spring manufacture and has a high degree of corrosion resistance. The flexure 302 is fabricated from stainless steel or other material suitable for spring composition and is designed to allow the imaginary plane 510 depicted in FIG. 8 to change it's angular orientation in relation to the centerline 260 as depicted by arrow 522 while preventing lateral movement of the wafer chuck 104 in relation to the cone 102 (arrow 254). The flexure 302 also permits the wafer chuck 104 to move along the centerline 260 as depicted by arrow 266. Other materials and spring types may be utilized as long as the ability to change the planar orientation while restraining lateral movement remains. Additionally, the desired spring constant may be adjusted by changing the geometric proportions of the flexure 302, including the width W and the ratio of widths between prongs, thickness, and length of legs 410, 412, and 332.

The plate 106 can be viewed in FIG. 8. The plate 106 has a plurality of chuck adjustment screws 110 running through the plate 106 and protruding below a lower side 252 of the plate 106. The chuck adjustment screws 110 have an spherical end 248 that are periodically contacted by a face 242 of a first actuator 240. The adjustment screws 110 control the orientation of the imaginary plane 510 (when in contact with the first actuator 240). The adjustment screws 110 would allow a user to correct any non-parallelism or planar inconsistencies between the wafer chuck 104 and an imaginary plane 512 of the retaining ring 502.

Continuing to view FIG. 8, the edge contact wafer cup 100 is illustrated preparing to "fixture" the wafer 514 to the retaining ring 502. The retaining ring 502 has a polishing side 508 and an outer diameter 518. The polishing side 508 has a bore 506. The outer diameter 518 has a cone centering guide 504. The cone centering guide 504 is concentric with the bore 506. When the cup 100 is raised by the second actuator 540, the cone centering guide 504 interfaces with the lip radius 204 of the cone 102 and forces the cone 102 to become aligned with the retaining ring 502 (see arrow 254 that indicates the lateral movement of the cone 102).

The first actuator 540 and the second actuator 240 may be driven by any conventional means including ball screws, hydraulics, pneumatic, stepper motors, servo motors, rodless cylinders, and the like.

In operation, the polishing sequence begins when the cup 100 receives the wafer 514 from a transfer mechanism 808 (shown in FIG. 1 and FIG. 2). The wafer 514 is centered in the cup 100 through the use of the wafer guide 206, whose angular orientation causes the wafer 514 to become centered on the wafer chuck 104. Once the retaining ring 502 is in position over the cup 100, the second actuator 540 is activated and rises to contact the cone support plate 224, causing the cone support plate 224 in turn to rise. As the cone support plate 224 moves upwards, the springs 220 apply a force to the cone 102 and sets the other cup 100 components in motion upwards as depicted by arrow 266a.

As the cone 102 begins to contact the retaining ring 502, the interplay between the lip radius 204 and the cone centering guide 504 causes the cone 102 to concentrically align with the retaining ring 502 (see arrow 254). Since the flexure 302 does not allow for lateral movement of the wafer chuck 104 in relation to the cone 102, the wafer chuck 104 and the wafer 514 also become concentrically aligned with the retaining ring 502.

Once a predetermined load pressure is sensed by the second actuator 540, the second actuator 540 stops and the first actuator 240 is activated to move upwards (see arrow 266). The first actuator 240 contacts the adjustment screws 110 protruding form the plate 106, causing the plate 106, wafer chuck 104 and wafer 514 to rise along centerline 260 as the flexure 302 deflects as depicted by arrow 266b. The wafer 514 is moved upwards into the retaining ring 502 until the wafer 514 becomes fix. within the bore 506.

Upon the wafer 514 becoming fixed in the retaining ring 502, the first actuator 240 and second actuator 540 are lowered allowing the cup 100 to disengage from the retaining ring 502. The retaining ring 502 then moves to a polishing station 806 shown in FIG. 2. When polishing is completed, the retaining ring 502, holding the wafer 514, returns to a position over the cup 100. The loadcup 100 re-engages the retaining ring 502. The wafer 514 is then released from the retaining ring 502 onto the wafer chuck 104 and finally returned by the transfer mechanism 808 to the system or cassette (not shown).

Figure 10:
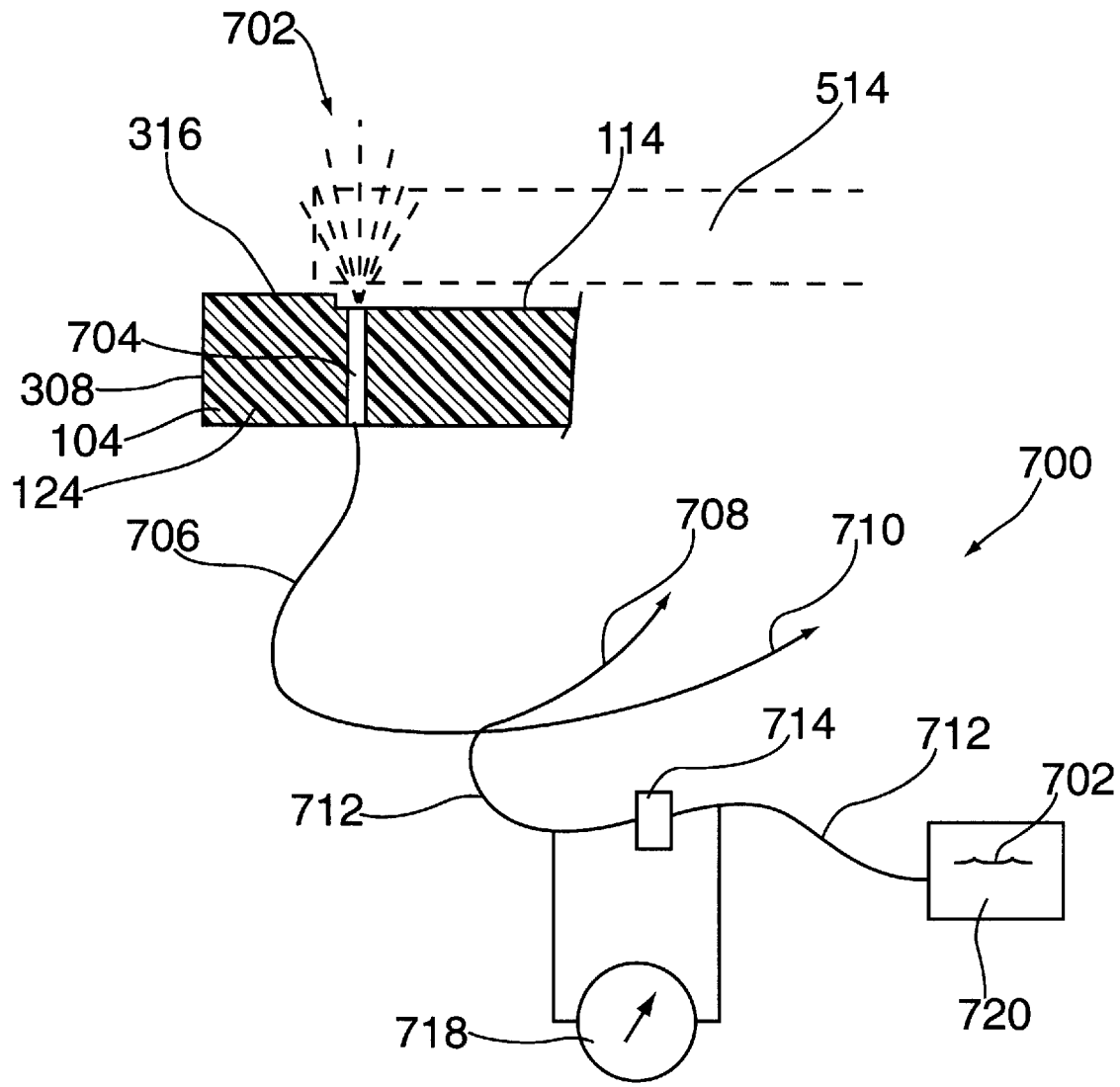
FIG. 10 is a schematic of the wafer chuck with a wafer sensor.

The wafer chuck 104 may also be equipped with a wafer sensor 700 as depicted in FIG. 10. Each leg 114 of the wafer chuck 104 has a portal 704 passing through the T-shaped end 124 at the wafer contact surface 316, preferably within 3 mm of the outside diameter of the wafer 514. Connected to each portal 704 is a conduit 706, 708 and 710. The conduits 706, 708 and 710 are connected to a supply conduit 712 that contains a restrictor 714. A differential pressure sensor 718 measures the pressure drop across the restrictor 714. The supply conduit 712 terminates at a supply 720. Alternately, each conduit 706, 708 and 710 may be fitted individually with a restrictor and differential pressure sensor.

The supply 720 typically delivers water 702 or other fluid at a low pressure, for example, 30 psi. The water 702 passes through the supply conduit 712, conduits 706, 708 and 710 and finally exiting through the portal 704 in the each leg 114 of the wafer chuck 104.

If a wafer 514 rests upon the wafer contact surface 316, the water 702 exiting the portal 704 impacts the wafer 514 and creates a back pressure in the line 706. The orifice or hole size of portal 704 is sized in conjunction with the supply pressure 720 as to allow the wafer 514 to "float" on a thin layer of water 702 which minimizes transference of contamination particles to the wafer 514 surface due to lack of contact with the wafer chuck 104. The back pressure, in turn, is sensed by the differential pressure sensor 718. The difference in pressure sensed is an indicator of whether the wafer 514 is positioned upon the wafer chuck 104, present inside the cone 102, or is not present. Additionally, as the wafer 514 flexes as it is loaded by an air bladder (not shown) inside the retaining ring 502 when the cone 102 and retaining ring 514 dock, a pressure fluctuation is detected by the sensors that correlates to the amount of force experienced by the wafer 514. Monitoring the pressure fluctuation allows for the force produced by the bladder on the wafer 514 to be controlled as not to damage the wafer 514. Other supply pressures may be utilized by one skilled in the art depending on conduit diameters, number of sensing portals 704 and amount of the restriction 714. Correspondingly, manipulation of the volume and velocity of the water 702 exiting the portal 702 can cause the wafer 514 to "float", assisting in centering the wafer 514 on the wafer chuck 104.

Although the sensor 700 is depicted as utilizing three portal 704 in a location on or near the wafer contact surface 316, this configuration is illustrative only. One skilled in the art may readily change the number and location of the portal 704. For example, at least one portal 704 at the center of the chuck 104 enables the user to detect the presence of the wafer 514 through monitoring the back pressure generated in the water 704 flow. Additionally, when individual sensors are used on each conduit 706, 708 and 710, the relative position of the wafer 514 in regards to the retaining ring 502 can be sensed. Alternately, the sensor 700 may be utilized having at least one portal 704 in the cone 104.

Although this illustrative embodiment discloses the use of the invention to fixture a wafer to a CMP machine, the invention is of equal value where ever the precise positioning of wafers into a fixture is required. As such, the teachings of the present invention that has been shown and described in detail herein, those skilled in the art can readily devise other varied embodiments that still incorporate the teachings and do not depart from the spirit of the invention.

What is claimed is:

1. Apparatus for transferring a semiconductor workpiece comprising:
   a cone;
   a flexure, connected to said cone;
   a chuck connected to said flexure;
   a cone support plate movably connected to said cone by a pin assembly, and
   a plurality of springs captured between said cone support plate and said cone.

2. The apparatus of claim 1 wherein said cone further comprises:
   a lip disposed on an outer diameter of said cone; and,
   a guide disposed on a radially inner side of said lip.

3. The apparatus of claim 1 wherein said pin assembly further comprises:
   a pin set partially in a first counter bore of said cone and partially in a hole in said cone support plate;
   a pad disposed in a counter bore concentric with said hole of said cone support plate;
   a bolt passing through said pin, said pad, said cone and said cone support plate, having a head set within a first counter bore of said cone; and,
   a nut disposed on said bolt capturing said pad within said counter bore, said nut adjustably setting the limit of separation between said cone and said cone support plate.

4. The apparatus of claim 1 wherein the flexure further comprises:
   a center connected to said chuck; and,
   a plurality of legs radiating from said center, said legs each having outer members connected to said center and an inner member connected to said cone.

5. The apparatus of claim 4 wherein the plurality of legs is three.

6. The apparatus of claim 1 wherein the chuck is a polymer.

7. The apparatus of claim 1 wherein the chuck further comprises:
   a wafer sensor.

8. The apparatus of claim 1 further comprising:
   a chemical mechanical polisher having one or more polishing stations.

9. Apparatus for polishing a semiconductor workpiece comprising:
   a chemical mechanical polisher having one or more polishing stations;
   one or more retaining rings for transferring said workpiece to said polishing stations and holding said workpiece during polishing;
   a cup assembly disposed within said chemical mechanical polisher, the cup assembly comprising a cone and a chuck connected to one another by a flexure; and a wafer sensor having
   at least one portal disposed in said chuck.

10. The apparatus of claim 9 further comprising:

a cone support plate;

a pin set partially in a first counter bore of said cone and partially in a hole in said cone support plate;

a pad disposed in a counter bore concentric with said hole of said cone support plate;

a bolt passing through said pin, said pad, said cone and said cone support plate, having a head set within a first counter bore of said cone; and, a nut disposed on said bolt capturing said pad within said counter bore, said nut adjustably setting the limit of separation between said cone and said cone support plate.

11. The apparatus of claim 9 wherein the flexure further comprises:

a center connected to said chuck; and, a plurality of legs radiating from said center, said legs each having outer members connected to said center and an inner member connected to said cone.

12. The apparatus of claim 11 wherein the plurality of legs is three.

13. The apparatus of claim 9 wherein the wafer sensor further comprises:

having a working fluid passing through a restrictor creating a pressure drop measured by a sensor.

14. The apparatus of claim 9 further comprising:

a plate coupled to said flexure;

a plurality of adjustment screws protruding from said plate; and an actuator for contacting said adjustment screws and imparting movement to said plate.

15. The apparatus of claim 9 wherein the chuck is a polymer.

16. Apparatus for transferring a semiconductor workpiece comprising:

a cone;

a flexure, connected to said cone;

a chuck connected to said flexure having a wafer sensor a lip disposed on an outer diameter of said cone; and, a guide disposed on a radially inner side of said lip.

17. The apparatus of claim 16 further comprising:

a cone support plate movably connected to said cone by a pin assembly;

a plurality of springs captured between said cone support plate and said cone;

a pin set partially in a first counter bore of said cone and partially in a hole in said cone support plate;

a pad disposed in a counter bore concentric with said hole of said cone support plate;

a bolt passing through said pin, said pad, said cone and said cone support plate, having a head set within a first counter bore of said cone; and, a nut disposed on said bolt capturing said pad within said counter bore, said nut adjustably setting the limit of separation between said cone and said cone support plate.

18. The apparatus of claim 16 further wherein the flexure further comprises:

a center connected to said chuck; and, a plurality of legs radiating from said center, said legs each having outer members connected to said center and an inner member connected to said cone.

19. The apparatus of claim 18 wherein the plurality of legs is three.

20. The apparatus of claim 16 wherein the chuck is a polymer.

21. The apparatus of claim 16 further comprising:

a chemical mechanical polisher having one or more polishing stations.

22. Apparatus for polishing a semiconductor workpiece comprising:

a chemical mechanical polisher having one or more polishing stations;

one or more retaining rings for transferring said workpiece to said polishing stations and holding said workpiece during polishing;

a cup assembly disposed within said chemical mechanical polisher, the cup assembly comprising a cone and a chuck connected to one another by a flexure;

a wafer sensor, having
   at least one portal disposed in said chuck.

23. The apparatus of claim 22 further comprising:

a cone support plate;

a pin set partially in a first counter bore of said cone and partially in a hole in said cone support plate;

a pad disposed in a counter bore concentric with said hole of said cone support plate;

a bolt passing through said pin, said pad, said cone and said cone support plate, having a head set within a first counter bore of said cone; and, a nut disposed on said bolt capturing said pad within said counter bore, said nut adjustably setting the limit of separation between said cone and said cone support plate.

24. The apparatus of claim 22 further wherein the flexure further comprises:

a center connected to said chuck; and, a plurality of legs radiating from said center, said legs each having outer members connected to said center and an inner member connected to said cone.

25. The apparatus of claim 24 wherein the plurality of legs is three.

26. The apparatus of claim 22 wherein the wafer sensor further comprises:

a working fluid passing through a restrictor creating a pressure drop measured by a sensor.

27. The apparatus of claim 22 further comprising:

a plate coupled to said flexure;

a plurality of adjustment screws protruding from said plate; and an actuator for contacting said adjustment screws and imparting movement to said plate.

28. The apparatus of claim 22 wherein the chuck is a polymer.

* * * * *

UNITED STATES PATENT AND TRADEMARK OFFICE
CERTIFICATE OF CORRECTION

PATENT NO. : 6,716,086 B1 Page 1 of 1
DATED : April 6, 2004
INVENTOR(S) : Jim Tobin It is certified that error appears in the above-identified patent and that said Letters Patent is hereby corrected as shown below:

Column 8,
Line 21, please change "pin assembly," to -- pin assembly; --.

Column 9,
Line 27, please delete "having".

Signed and Sealed this

Fifteenth Day of February, 2005

JON W. DUDAS
*Director of the United States Patent and Trademark Office*